June 23, 1953 G. D. HULST 2,642,746

TELEVISION TUNING DEVICE

Filed Dec. 21, 1950

INVENTOR.
GEORGE D. HULST
BY Darby & Darby
ATTORNEYS

Patented June 23, 1953

2,642,746

UNITED STATES PATENT OFFICE 2,642,746

TELEVISION TUNING DEVICE

George D. Hulst, Upper Montclair, N. J., assignor to Allen B. Du Mont Laboratories, Inc., Clifton, N. J., a corporation of Delaware Application December 21, 1950, Serial No. 201,907

7 Claims. (Cl. 74—10.7)

This invention relates to tuning indicating apparatus and the like and particularly to tuning indicating apparatus adapted for use in a combination television and frequency modulation receiver.

In receivers of this type employing continuous tuning over the entire television and frequency modulation of FM frequency bands range, it has been desirable to expand certain portions of the indicating scale and to compress other portions. This is for the purpose of tuning slowly and accurately through the relatively compressed FM bands and yet readily through the widespread television frequency bands. Such a device is described in Patent No. 2,615,420 assigned to the present assignee.

It is an object of this invention to provide an indicating mechanism in which certain portions of the indicating scale are expanded and other portions compressed.

It is another object to provide a tuning indicator which is reliable, simple, inexpensive, and adaptable to quantity manufacture.

It is a further and particular object to provide an indicating mechanism especially adapted for use as an indicator for continuously tunable television receivers.

In accordance with the invention, a television and frequency modulation receiver tuning mechanism is linked to an indicating mechanism through a dial cord drive, utilizing as a portion of the linking mechanism a cam pulley grooved continuously in a helix of variable diameter.

Figure 1:
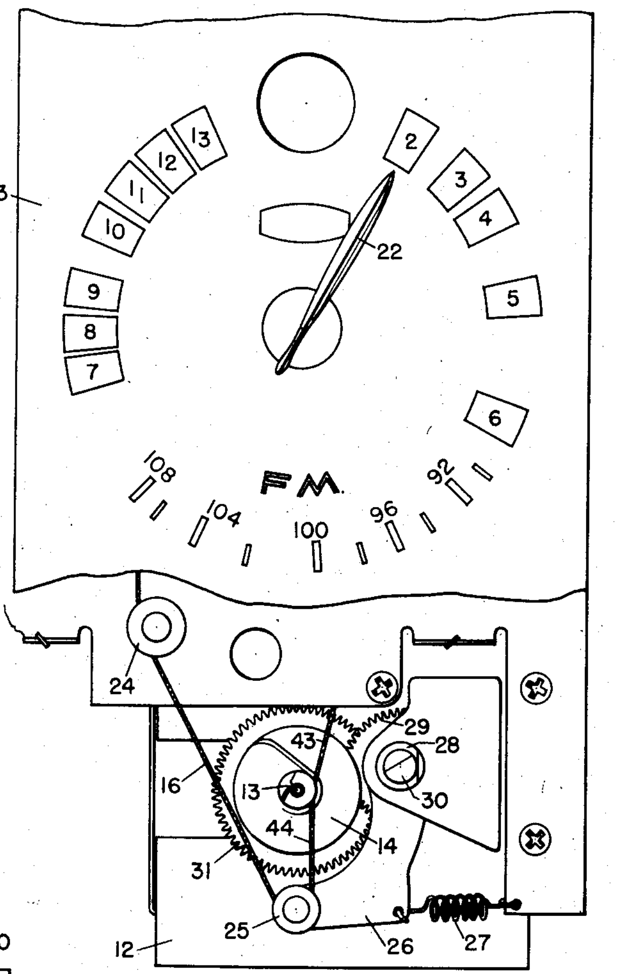
Figure 1 is a front view of the tuning mechanism partially cut away.
Figure 2:
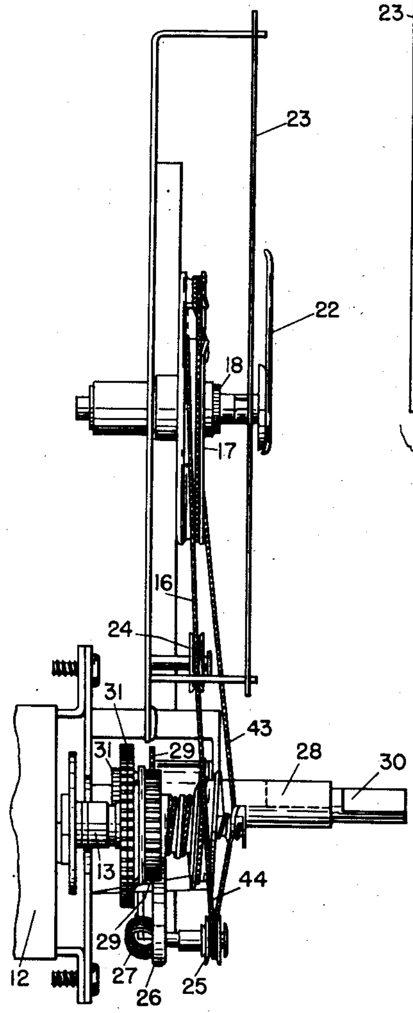
Figure 2 is a side view of the mechanism of Figure 1.

A preferred embodiment of the invention is illustrated with an electrical tuning mechanism 12 of a well known type continuously tunable by means of a rotatable tuning shaft 13 over a low frequency television band, a frequency modulation band, and an upper television band. A cam pulley 14 which is a feature of the invention is firmly affixed to the tuning shaft 13.

A flexible member or dial cord 16 engages the cam pulley 14 preferably having its ends affixed thereto. A second or indicating pulley 17 mounted on a rotatable shaft 18 engages the dial cord 16. A pointer 22 affixed to the shaft 18 and a numbered dial 23 together with the second pulley 17 comprise the indicating apparatus.

Idler wheels 24 and 25 are provided to guide the dial cord 16. One such idler wheel 25, located on the lower side of the cam pulley 14, is preferably mounted on a rocker arm 26 having a tension spring 27 attached to a lower corner thereof to maintain the tension of the dial cord 16.

In the preferred form shown the tuning shaft 13 engages a first tuning shaft 28, through gear wheels 29 for course tuning. A second tuning shaft 30, coaxial with the shaft 28, engages the tuning shaft 13 by means of gear wheels 31 for fine tuning. These course and fine tuning shafts 28, 30 have their front ends flattened to receive manual tuning knobs.

Figure 3:
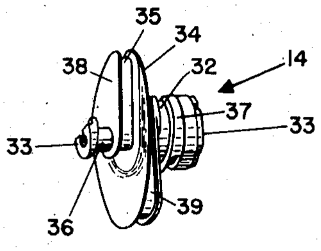
Figure 3 is a perspective view of a cam pulley which is a feature of the invention.

The cam pulley 14 shown in detail in Figure 3, comprises a continuous helical surface 32 providing a smooth surfaced path for cord 16, parallel at all points to the axis 33 but varying in radial distance therefrom to vary the speed of the cord 16 and pointer 22 to provide the bandspread or band compression desired. A beveled flange 34 extends outwardly beyond and adjacent the surface 32 and along its entire helical length, separating adjacent turns of the helical path and serving as a guide for the dial cord 16. The helical surface comprises a central cylindrical portion 35 of uniform large radius to provide bandspread indication for the frequency modulation band, and end cylindrical portions 36, 37 of uniform smaller radius providing band compression in the lower and upper television bands respectively. Transition portions 38 and 39 of varying radius are located axially between and contiguous to the central and end portions of the helical surface, forming the path therebetween. In the view of Figure 3 one transition portion 38 is wholly visible, the other similar transition portion 39 being partially hidden behind the flange 34.

In the operation of the device, the dial cord 16, having one end thereof terminating at the front end of the cam pulley, extends from the first or front smaller annular path 36, engaging in order the indicator pulley 17, the idler pulley 24, the idler pulley 25, and back to be wound helically around the cam pulley 14 to the other smaller annular path 32, to terminate at the rear end thereof.

As the tuning shaft 13 is revolved manually in a clockwise direction from the position at channel 2, shown in Figure 1, the end 43 of the dial cord 16 is wound helically on the cam pulley, and the other end 44 is unwound therefrom, moving the pointer 22 clockwise slowly in order through the television channels 3, 4, and 5 of the lower television band. Band compression of the indicator dial is provided because of the relatively large ratio between the diameters of the indicator pulley 17 and the front end path 36 of the cam pulley 14.

As the shaft 13 continues to be turned in a clockwise direction approaching a condition for tuning frequency modulation signals between 88 and 108 megacycles, the ends 43, 44 of the dial cord wind outwardly through the transition portion 38 of the cam pulley 14 to the central larger portion or path 35 thereof. The smaller ratio of diameters of portion 35 of cam 14 and the indicator pulley 17, provide bandspread for tuning through frequency modulation channels.

As the shaft 13 continues to be turned in a clockwise direction, the ends 43, 44 of the dial cord pass inwardly through the other transition region 39 to the rear smaller annular path 32 of the helical surface herein again achieving band compression. When the tuner has been tuned to television channel 13 at the upper end of the tuning range, the end 44 of the dial cord will then be completely unwound from the cam pulley 14 and the other end 43 will be wound along the complete length of the helical surface.

The idler pulleys 24 and 25 may be made free for motion in an axial direction. As the end 44 of the dial cord is either wound or unwound, the idler pulleys move axially, allowing the end 44 of the dial cord to engage the cam pulley 14 in a direction nearly perpendicular to the axis of rotation thereof.

Although a preferred embodiment has been shown and described, the scope of this invention is defined by the following claims.

What is claimed is:

1. A drive pulley rotatably mounted to revolve about an axis and comprising a first cylindrical portion having an outer surface equidistant from said axis, a second cylindrical portion having an outer surface coaxial with said first portion but differing in diameter therefrom, a transition portion located between said first and second portions and having an outer surface contiguous with said outer surfaces of said first and second portions, and a flange along the edge of said outer surfaces extending tangentially therefrom, separating adjacent turns thereof, and extending the entire axial length thereof.

2. A band expansion pulley for a tuning indicator rotatably mounted to revolve about an axis and comprising a continuous flat surface extending helically about said axis and at varying radial distances therefrom, said surface having throughout its helical length a portion thereof parallel to said axis, said radial distances varying discontinuously along said helical length, and a beveled flange extending tangentially outwardly from and separating adjacent turns of said surface along the axial length thereof.

3. A tuning device comprising a tuning mechanism tunable over a range of frequencies and having a rotatable tuning shaft, a first pulley engaging and rotatable with said tuning shaft, a second pulley forming a portion of a tuning indicator, one of said pulleys being a cam pulley containing a first cylindrical outer surface, a second cylindrical outer surface of a diameter different from said first surface, a transition portion having an outer surface contiguous with said first and second outer surfaces, and a flange extending helically the axial length of said first surface, said second surface, and said transition portion, and a flexible member engaging said pulleys.

4. The device of claim 3 in which said flexible member engages a third pulley, said cam pulley being between said other two pulleys in the order of engagement with said member.

5. A tuning device comprising a tuning mechanism tunable over a range of frequencies and having a rotatable tuning shaft, a pulley engaging and rotatable with said tuning shaft, said pulley containing a first cylindrical outer surface, a second cylindrical outer surface of a diameter different from said first surface, a transition portion having an outer surface contiguous with said first and second outer surfaces, and a flange extending helically the axial length of said first surface, said second surface, and said transition portion, an indicating mechanism, and a flexible member engaging said pulley and said indicating mechanism.

6. A combined television and FM tuning device comprising a tuning mechanism tunable by means of a single rotatable shaft over a low television band, a frequency modulation band, and a high television band, in that order, a pulley engaging and rotatable with said tuning shaft, said pulley containing a central cylindrical portion having an outer surface, end cylindrical portions having outer surfaces of less diameter than said central portion, transition portions located axially between said central portion and said end portions and having an outer surface contiguous with said outer surfaces of said central and said end portions, and a flange extending helically the axial length between and including said end portions, an indicating mechanism, and a flexible member engaging and coupling said pulley and said indicating mechanism, the positions of said transition portions being located on said pulley so that the coupling ratio of said indicating mechanism with respect to said tuning mechanism is changed between the tuning positions of said bands.

7. The device in accordance with claim 4, in which said third pulley is positioned on a fixedly positioned elongated shaft and is axially slidable thereon.

GEORGE D. HULST.

References Cited in the file of this patent

UNITED STATES PATENTS

| Number | Name | Date |
|---|---|---|
| 2,161,762 | Marholz | June 21, 1938 |
| 2,131,797 | Dreyfus | Oct. 4, 1938 |
| 2,491,341 | Tillman | Dec. 13, 1949 |
| 2,526,610 | Piton | Oct. 17, 1950 |